United States Patent [19]
Burkhart et al.

[11] Patent Number: 5,902,394
[45] Date of Patent: May 11, 1999

[54] OSCILLATING CRUCIBLE FOR STABILIZATION OF CZOCHRALSKI (CZ) SILICON MELT

[75] Inventors: Charles Curtis Burkhart; Bruce Laurence Colburn, both of Vancouver, Wash.

[73] Assignee: SEH America, Inc., Vancouver, Wash.

[21] Appl. No.: 08/831,484

[22] Filed: Mar. 31, 1997

[51] Int. Cl.[6] .................................................. C30B 15/30
[52] U.S. Cl. .............................. 117/13; 117/28; 117/213; 117/935
[58] Field of Search ................................ 117/13, 28, 213, 117/935

[56] References Cited

U.S. PATENT DOCUMENTS

| 5,306,387 | 4/1994 | Fusegawa et al. | 117/28 |
| 5,471,943 | 12/1995 | Scheel | 117/28 |
| 5,474,019 | 12/1995 | Akashi et al. | 117/28 |

FOREIGN PATENT DOCUMENTS

| 429847 | 6/1991 | European Pat. Off. | 117/28 |
| 63-17291 | 1/1988 | Japan | 117/28 |

OTHER PUBLICATIONS

Scheel et al., "Crystal Rotation in Crystal Growth From Melt", IBM Technical Disclosure Bulletin, vol. 14, No. 5 pp. 169, Oct. 1971.

"Characterization of Silicon Crystals Grown By The Heat Exchanger Method", S. Hyland, et al., Proceedings of the Electrochemical Society; vol. 83–11, pp. 192–199, '1983.

"Silicon Ingot Growth By An Oscillating Crucible Technique", Katherine A. Dumas, et al., Proc SPIE–Photovoltaic for Solar Energy Applications; pp. 121–125; 1983.

"Directional Solidification of Silicon In Carbon Crucibles By An Oscillating Crucible Technique", T. Daud, et al., Conference record of the 16th IEEE Photovoltaic Specialists Conference; pp. 63–67; 1982.

*Primary Examiner*—Robert Kunemund
*Attorney, Agent, or Firm*—Alston & Bird LLp

[57] ABSTRACT

A method is provided for stabilizing Czochralski (CZ) silicon melt by controlled oscillation of the crucible rotation during the stabilization period of the silicon melt to reduce the gas bubbles and unmelted polysilicon particles contained therein and thereby increase the yield and productivity of CZ silicon crystal production. The crucible rotation is controlled to follow an Oscillating Crucible Rotation (OCR) pattern or a saw tooth rotation pattern, which include rapid oscillations between a high rate of rotation and a low rate of rotation of the crucible during a period prior to the growth of the CZ crystal ingot.

30 Claims, 4 Drawing Sheets

OSCILLATING CRUCIBLE FOR STABILIZATION OF CZOCHRALSKI (CZ) SILICON MELT

BACKGROUND OF THE INVENTION

1. Area of the Art

The present invention generally relates to the field of manufacturing single Czochralski (CZ) silicon crystals. More particularly, it relates to a method of stabilization of a CZ silicon melt contained in the crucible of a CZ silicon crystal puller.

2. Description of the Prior Art

Czochralski (CZ) silicon crystals are produced by growing single crystal silicon ingots from molten polysilicon contained in a crucible of a CZ silicon crystal puller. However, the molten polysilicon often contains gas bubbles and unmelted polysilicon particles that may stick to the sidewall of the crucible. These bubbles and polysilicon particles can cause the formation of dislocations in crystal growth by aggregating at the liquid-solid interface during the freezing process.

In a conventional process of manufacture, heating elements and heat shields are carefully arranged in a CZ silicon crystal puller to produce temperature convection currents within the molten silicon to establish balanced axial and radial temperature gradients, while the crucible is rotated at a constant, low RPM (rotations per minute) for the purpose of stabilizing the silicon melt. However, the temperature convection currents naturally occurring within the molten silicon and the constant low RPM rotation rate of the crucible are not sufficient to release all gas bubbles and polysilicon particles stuck on the crucible wall.

Several prior art references have disclosed the technique of oscillating the crucible during the ingot growth period. For example, Hyland et al. ("Characterization of Silicon Crystals Grown by the Heat Exchanger Method"; S. Hyland, K. A. Dumas, G. H. Schwuttke, J. A. A. Engelbrecht, D. Leung; Proceedings of the Electrochemical Society; Volume 83-11; Pages 192–199, 1983) disclosed the application of an oscillating crucible technique (OCT) in the heat exchanger method (HEM) for silicon ingot growth. This method utilizes a shaping quartz mold in which molten silicon contained in a crucible solidifies from a single crystal seed.

Katherine A. Dumas et al. ("Silicon Ingot Growth By An Oscillating Crucible Technique"; K. A. Dumas, G. H. Schwuttke, T. Daud; Proc SPIE—Photovoltaics for Solar Energy Applications; Page 121; 1983) also disclosed the application of an OCT for casting silicon crystal from a melt within a crucible, to maintain a sufficiently fast liquid flow at the crystal surface, control localized nucleation, prevent supercooling, and avoid dendritic growth after nucleation.

Daud et al. ("Directional Solidification of Silicon In Carbon Crucibles by an Oscillating Crucible Technique"; T. Daud, K. A. Dumas, G. H. Schwuttke, P. Smetana, K. M. Kim; Conference record of the 16th IEEE Photovoltaic Specialists Conference; Page 63, 1982) further disclosed the application of an OCT for directional solidification of silicon in carbon crucibles.

However, in all of the above cited prior art references, the crucible is oscillated during the growth period of the silicon ingot, not during the stabilization period of the molten silicon—a period preceding the growth period. Further, the oscillation of the crucible is designed and conducted for the purpose of crystal growth, not for the purpose of reducing the bubbles and polysilicon particles contained in the silicon melt.

It is desirable to provide a method of effectively eliminating or at least substantially reducing gas bubbles and polysilicon particles contained in the silicon melt during its stabilization period, to therefore increase the yield and productivity of CZ silicon crystal production.

SUMMARY OF THE INVENTION

It is an object of the present invention to provide a method for solving the above-mentioned problems, and particularly to provide a method for effectively eliminating or at least substantially reducing gas bubbles and polysilicon particles contained in the silicon melt during its stabilization period, and therefore increase the yield and productivity of CZ silicon crystal production.

These and other objects and advantages are achieved by providing a novel method of stabilizing a silicon melt contained in a crucible of a Czochralski (CZ) silicon crystal puller which is utilized for growing a single crystal ingot. The method comprises the steps of providing a mechanism capable of rotating the crucible at various rates of rotation and varying the rates of rotation during a given period prior to the growth of the crystal ingot such that the bubbles and polysilicon particles contained in the silicon melt are reduced.

The methods of the present invention have been found to provide a number of advantages. As explained in greater detail below, it has been found that by varying the rotation of the crucible during the stabilization period of the silicon melt, the gas bubbles and unmelted polysilicon particles contained therein can be reduced. As a result, the methods of the present invention improve the quality of crystal ingots and therefore increase the single crystal silicon ingot yield. The methods of the present invention also improve crystal ingot productivity by reducing common troubles during crystal growth.

The methods of the present invention are well suited for use during single silicon crystal manufacture by CZ methods. They may be applied for re-charging polysilicon into the crucible. They may also be applied to any crucible type, single crystal pulling process, such as liquid encapsulation CZ of gallium arsenide (GaAs) ingots or the like.

The invention is defined in its fullest scope in the appended claims and is described below in its preferred embodiments.

DESCRIPTION OF THE FIGURES

The above-mentioned and other features of this invention and the manner of obtaining them will become more apparent, and will be best understood by reference to the following description, taken in conjunction with the accompanying drawings. These drawings depict only a typical embodiment of the invention and do not therefore limit its scope. They serve to add specificity and detail, in which.

DETAILED DESCRIPTION OF THE INVENTION

Figure 1:
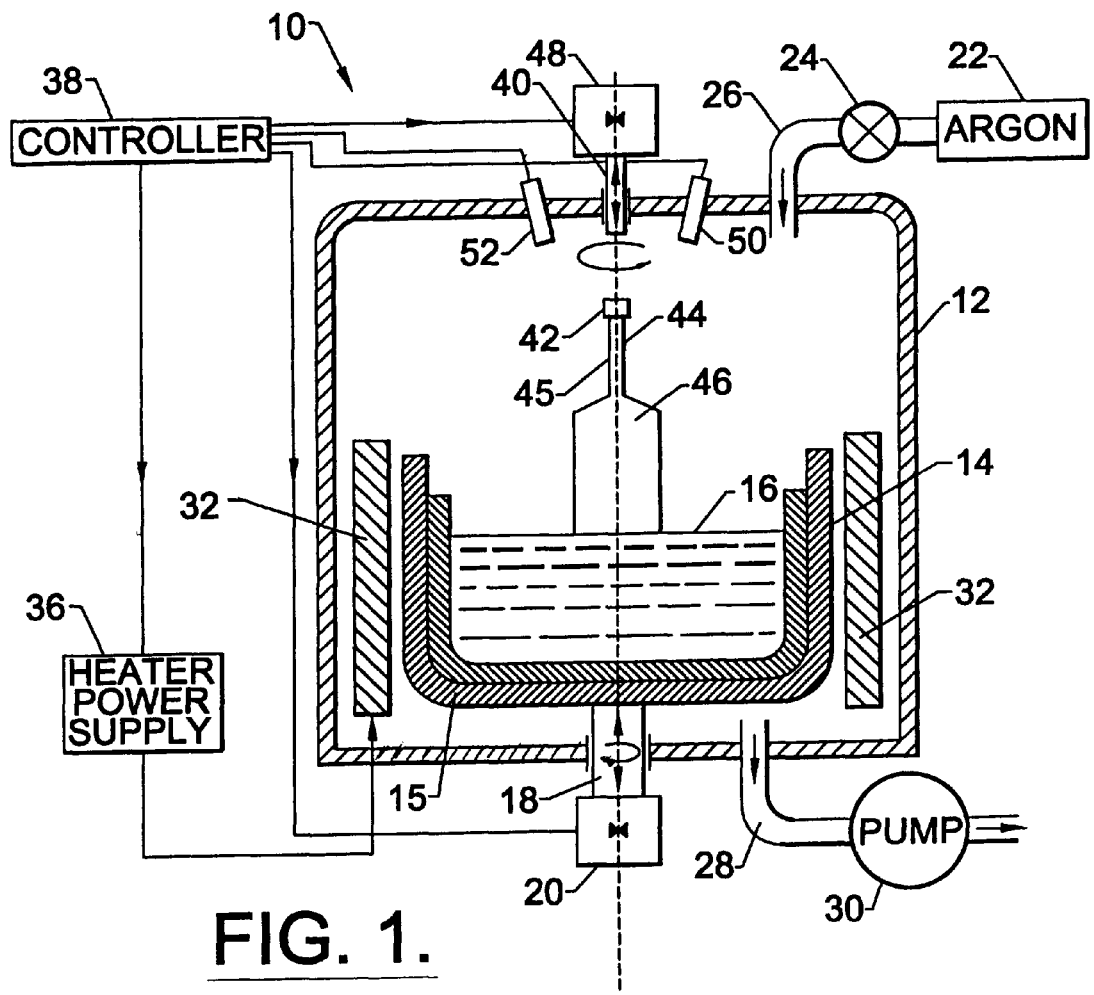
FIG. 1 is an illustrative diagram depicting the arrangement of a Czochralski (CZ) silicon crystal puller, which utilizes the present invention.

Referring to FIG. 1, there is shown an illustrative diagram of a Czochralski (CZ) silicon crystal manufacturing apparatus or CZ crystal puller 10, which utilizes the present invention.

CZ silicon crystal manufacturing apparatus 10 comprises a hermetically sealed furnace 12. Located at the center of the CZ crystal puller 10 is a quartz crucible 14 for containing polysilicon melt 16. The crucible 14 is assembled within a graphite susceptor 15, which is in turn mounted on a crucible rotary shaft 18. The crucible 14 can be rotated by the crucible rotary shaft 18, driven by a rotary shaft motor 20.

The CZ crystal puller 10 also comprises an argon source 22 which supplies argon gas to the CZ crystal puller 10. The gas flow is controlled by the argon gas inlet valve 24 before introduction into the hermetically sealed furnace 12 through the argon gas inlet 26 located at the upper corner of the furnace 12. The exhaust gases are removed from the furnace 12 through a gas outlet 28 located at the lower corner of the furnace 12. A pump 30 is connected to the gas outlet 28 to provide suction.

A heating element 32 is assembled surrounding the graphite susceptor 15 between the graphite susceptor 15 and the hermetically sealed furnace 12 to provide heating to the quartz crucible 14. A heater power supply 36 is connected to the heating element 32 to power the heating element. A controller 38 is connected to the heater power supply 36 to control the heater power supply 36.

An elongated rotary shaft 40 extends downwardly through the top of the furnace 12 for suspending a crystal chuck 42 and seed 44. During crystal growth, a crystal neck section 45 is first formed. Then a single crystal ingot 46 is formed as the molten silicon 16 crystallizes at the liquid-solid interface between the single crystal ingot 46 and the molten silicon 16 while the rotary shaft 40 pulls the silicon crystal ingot 46 from the molten silicon 16. During the crystal growth period, the crystal ingot 46 is rotated by the rotary shaft 40, which is driven by a rotary shaft motor 48. Typically, the crystal ingot 46 is rotated in one direction, while the crucible 14 is rotated in an opposite direction by the crucible rotary shaft 18, to facilitate the formation of the crystal ingot 34.

A camera 50 and a pyrometer 52 are located on the top of the furnace 12 to supply data to the controller 38. The controller 38 controls the rotation of the rotary shaft motor 48, the crucible rotary shaft motor 20, and the heater power supply 36 output for optimizing process conditions.

The rotation of the crucible 14 is controlled by the controller 38. According to the methods of the present invention, the crucible 14 is rotated during the initial melt down stabilization period, before the growth of the crystal ingot, for the purpose of releasing the gas bubbles and polysilicon particles contained in the molten polysilicon. Moreover, the rotation of the crucible 14 is controlled by the controller 38 to follow a predetermined pattern, wherein the rate of crucible rotation is varied in oscillating fashion. The controller 38 comprises a computer which can program the predetermined rotation pattern. It is the discovery of the present invention that changes in the rate of the crucible rotation will generate the desired result; that is to reduce the bubbles and polysilicon particles contained in the silicon melt.

Figure 2:
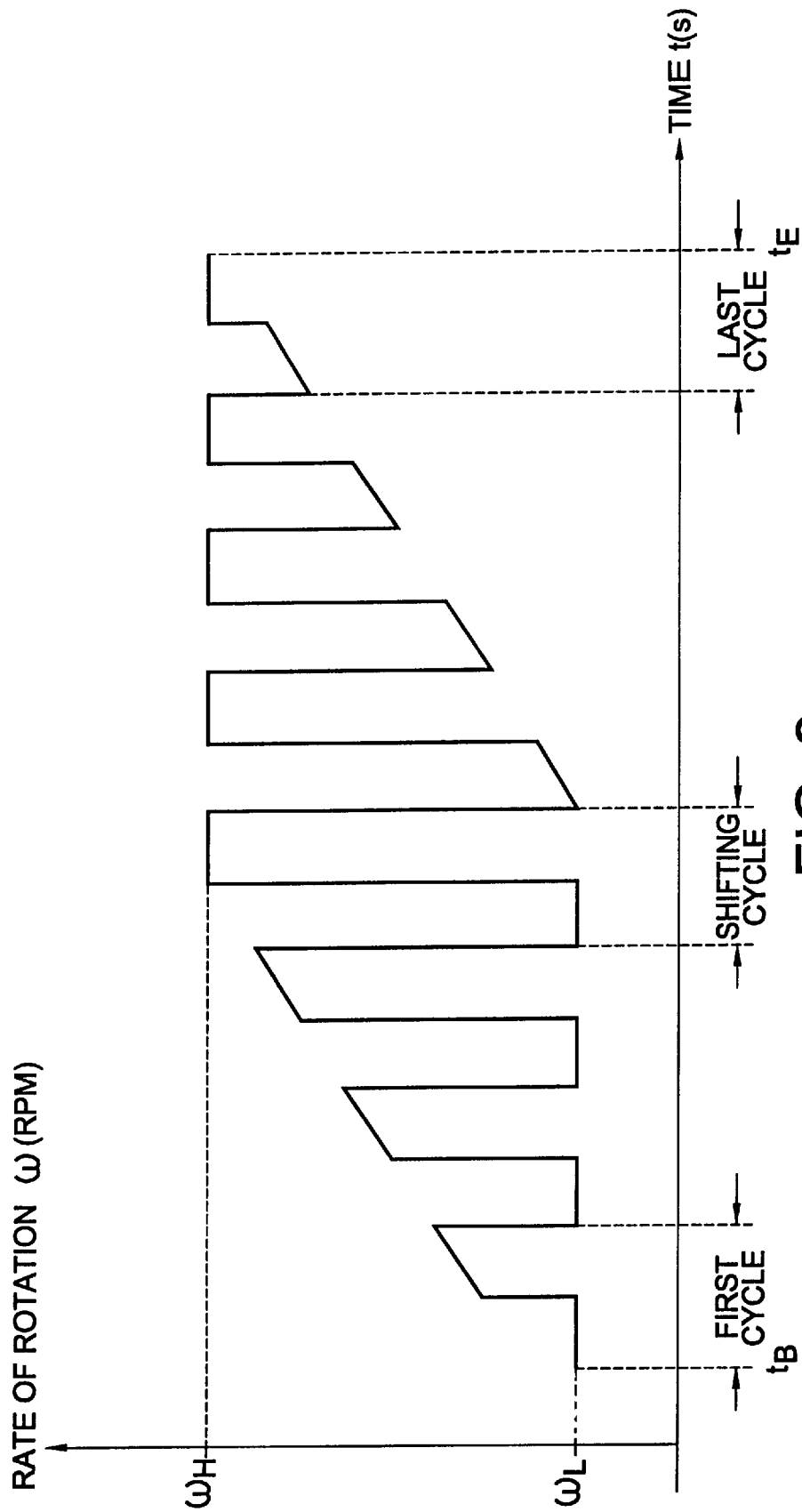
FIG. 2 is an illustrative diagram showing a preferred embodiment of a method according to the present invention.
Figure 3A:
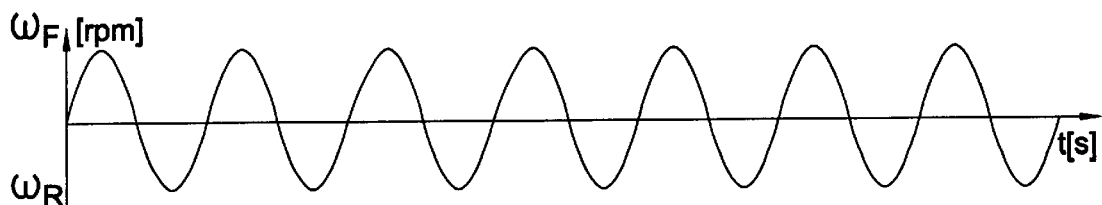
FIG. 3a to 3f is an illustrative diagram showing different rotational patterns in accordance with the present invention.
Figure 3B:
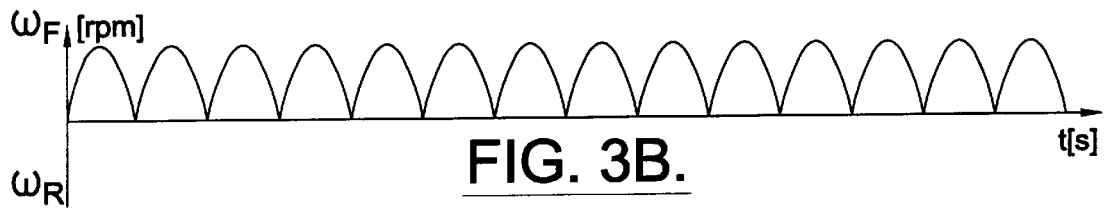
Figure 3C:
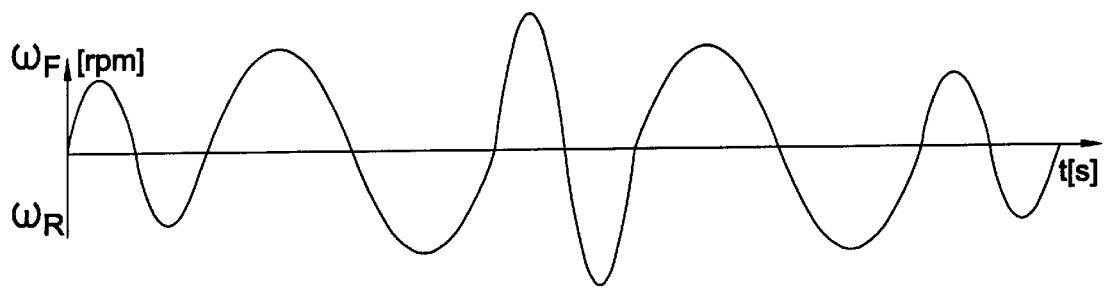
Figure 3D:
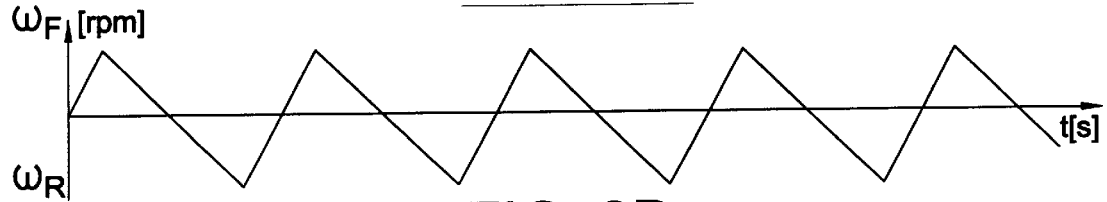
Figure 3E:
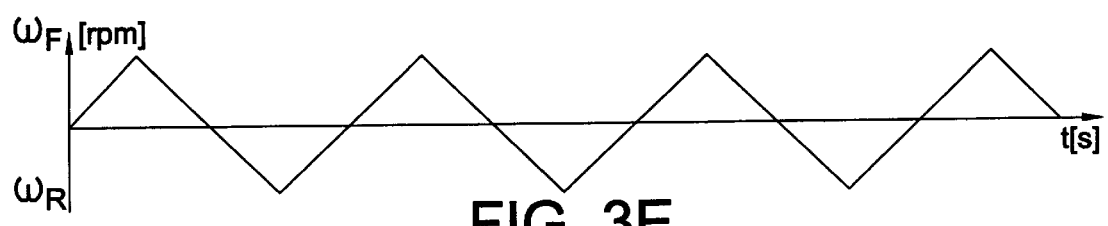
Figure 3F:
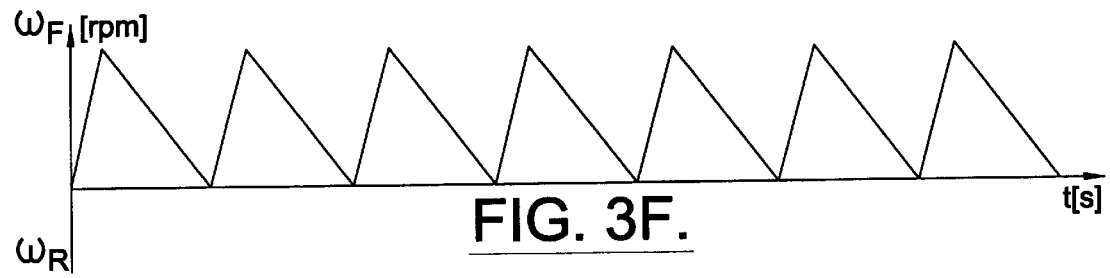

Referring to FIG. 2, there is shown an Oscillating Crucible Rotation (OCR) pattern illustrating one of the preferred embodiments of the present invention. The OCR pattern is shown as a curve of the rate of rotation ($\omega$) in RPM as a function of the time (t) in seconds. The rate of rotation $\omega$ is controlled to "oscillate" or "alternate" between a high rate of rotation $\omega_H$ and a low rate of rotation $\omega_L$, following a predetermined pattern, within the time period between a beginning time $t_B$ and an ending time $t_E$.

The predetermined OCR pattern may contain a series of consecutive cycles, including a first cycle, several intermediate cycles and a last cycle. For example, it can be observed from FIG. 2 that the OCR pattern shown therein contains the following cycles:

(1) in the first half of the first cycle, at the beginning time $t_B$ the rate of rotation starts at the low rate of rotation $\omega_L$ and remains constant thereat, but in the second half of the cycle the rate of rotation accelerates up to a higher level and gradually increases therefrom;

(2) in the second cycle, which immediately follows the first cycle, in the first half of the cycle the rate of rotation oscillates back to the low rate of rotation $\omega_L$ and remains constant thereat, but in the second half of the cycle the rate of rotation again accelerates to an even higher level and gradually increases therefrom;

(3) in each subsequent cycle the "amplitude" or "magnitude" of the oscillation, i.e., the changes in the rate of rotation in each oscillation, increases, until it reaches a maximum amplitude that equals the difference between $\omega_H$ and $\omega_L$ in the "shifting" cycle;

(4) in the first half of the "shifting" cycle, the rate of rotation oscillates back to the low rate of rotation $\omega_L$ and remains constant thereat, and in the second half of the cycle, the rate of rotation accelerates to the high rate of rotation $\omega_H$ and remains constant thereat;

(4) in the cycle immediately following the shifting cycle, in the first half of the cycle the rate of rotation oscillates back to the low rate of rotation $\omega_L$ but gradually increases therefrom, and in the second half of the cycle the rate of rotation oscillates back to the high rate of rotation $\omega_H$ and remains constant thereat;

(5) in each one of the subsequent cycles, the amplitude decreases; and (6) finally, in the first half of the last cycle, the rate of rotation oscillates back to the level slightly below the high rate of rotation $\omega_H$ and gradually increases therefrom, but in the second half of the cycle the rate of rotation oscillates back to the high rate of rotation $\omega_H$ and remains constant thereat, until the end of the cycle, which is also the end of the OCR pattern, at the ending time $t_E$.

In a preferred embodiment, the high rate of rotation $\omega_H$ is equal to the desired rotation rate of the crucible while growing the crystal neck section. $\omega_L$, on the other hand, is equal to the desired rotation rate of the crucible at the completion of the meltdown.

It is to be understood that the Oscillating Crucible Rotation (OCR) pattern depicted in FIG. 2 has been chosen only for the purpose of describing a particular embodiment and function of the invention, and that the rotation of the crucible can be changed in any other patterns to achieve the desired result; that is to reduce the bubbles and unmelted polysilicon particles contained in the melt during the melt down stabilization period. For example, the rotation of the crucible can be changed in accordance with the patterns depicted in FIG. 3 during the initial melt down stabilization period.

In FIG. 3, a rotation change pattern is shown as a curve of the rate of rotation ($\omega$) in RPM as the function of the time in seconds (t[s]). The rate of rotation $\omega$ is controlled to "alternate" between a forward rate of rotation (clockwise) $\omega_F$ and a reverse rate of rotation (counter clockwise) $\omega_r$, following a predetermined pattern, within a predetermined time period. FIG. 3 (a) depicts an oscillating rotational change. FIG. 3 (b) depicts a single phase oscillating rotational change between 0 rpm (revolutions per minute) and a maximum rpm. FIG. 3 (c) depicts an oscillating rotational change with varying amplitude and frequency. FIG. 3 (d)

depicts a fast rising and slow falling saw tooth rotational change between forward and reverse rotations. FIG. 3 (e) depicts an even saw tooth rotational change. FIG. 3 (f) depicts a fast rising, slow falling saw tooth rotational change between 0 and maximum rpm.

One of the critical features of the present invention is the rapid shift between a high rate of rotation and a low rate of rotation, which increases the shear force between the silicon melt and the sidewall of the crucible. This increased shear force has the effect of releasing the bubbles and polysilicon particles stuck on the crucible wall, thereby substantially reducing the existence of the gas bubbles and unmelted polysilicon particles contained in the silicon melt. Therefore, an important parameter of the methods of the present invention is the rapidity of oscillation from one rotational rate to a different rotational rate.

In a preferred embodiment, the change of oscillation from one rotational rate to a different rotational rate happens within a range of less than 20 seconds. The rate of rotation can be as high as 16 rpm, and as low as 4 rpm. In general, the rate of rotation can be as high as any necking condition or crucible rotation, or as low as the low rotation taking place after the completion of the meltdown.

It is to be understood that the rate of the rotation of the crucible may vary depending on the desired interstitial oxygen concentration ($O_i$), radial oxygen concentration rings (ROG), radial resistivity gradients (RRGs) and crystal diameter which also determines the charge size. The determination of the rate of the rotation, however, is well within the skill in the art in view of the instant disclosure.

Practical cycles can vary between 1 second and 999 seconds and be applied as needed depending on the operating procedure owing to the charge amount, crystal diameter, and the like. In general, the cycles must be designed to generate a rotation pattern which increases the shear force between the silicon melt and the sidewall of the crucible so as to have the effect of releasing the bubbles and polysilicon particles stuck on the crucible wall.

Other means of releasing bubbles in the melt or polysilicon particles from the crucible wall may also be used. Examples of such means include, but are not limited to, crucible tapping, heater element movement, and ultra-sound agitation.

The present invention drastically reduces bubble adherence to the crucible wall within the melt which in turn results in better crystals with fewer or no dislocations. The methods of the present invention also improve productivity by reducing common troubles during crystal growth.

Methods of the present invention can reduce the stabilization time—a time required for the molten silicon to be ready for the dipping of the seed crystal. Based on the tests done on 19 samples, the average stabilization time required by using the methods of the present invention was about 92.5% of the time that would be required using the conventional method. In other words, the present invention requires a shorter stabilization time.

The present invention also resulted in single crystal silicon ingot yield improvements owing to a lower dislocation density. Using the new method of an oscillating crucible during stabilization, the neck troubles were reduced by 43.5%, the body troubles were reduced by 22.4%, the number of dislocation free crystals was increased by 23%, the intermediate yield was increased by 14.6%, and the intermediate productivity was increased by 15.6%. The parameters used above are defined as follows:

Neck Trouble: the neck trouble parameter is a numerical fraction of crystals having trouble during necking over the total number of crystals pulled.

Body Trouble: the body trouble parameter is a numerical fraction of crystals having trouble during the ingot growth over the total number of crystals pulled.

DF Ratio: the DF ratio is the ratio of dislocation free crystals to the total number of crystals grown.

Intermediate Yield: the intermediate yield is defined as:

$$Y_{int} = (W_{int}/W_{poly}) \times 100\%$$

where:

$Y_{int}$ is the intermediate yield, $W_{poly}$ is the starting amount of the charge size, and $W_{int}$ is the intermediate weight of the crystal defined as:

$$W_{int} = W_{cryst} - (W_{cap} + W_{tail})$$

where:

$W_{cryst}$ is the crystal weight after grinding, $W_{cap}$ is the cap-end weight of the crystal, and $W_{tail}$ is the tail end weight of the crystal.

Figure 4:
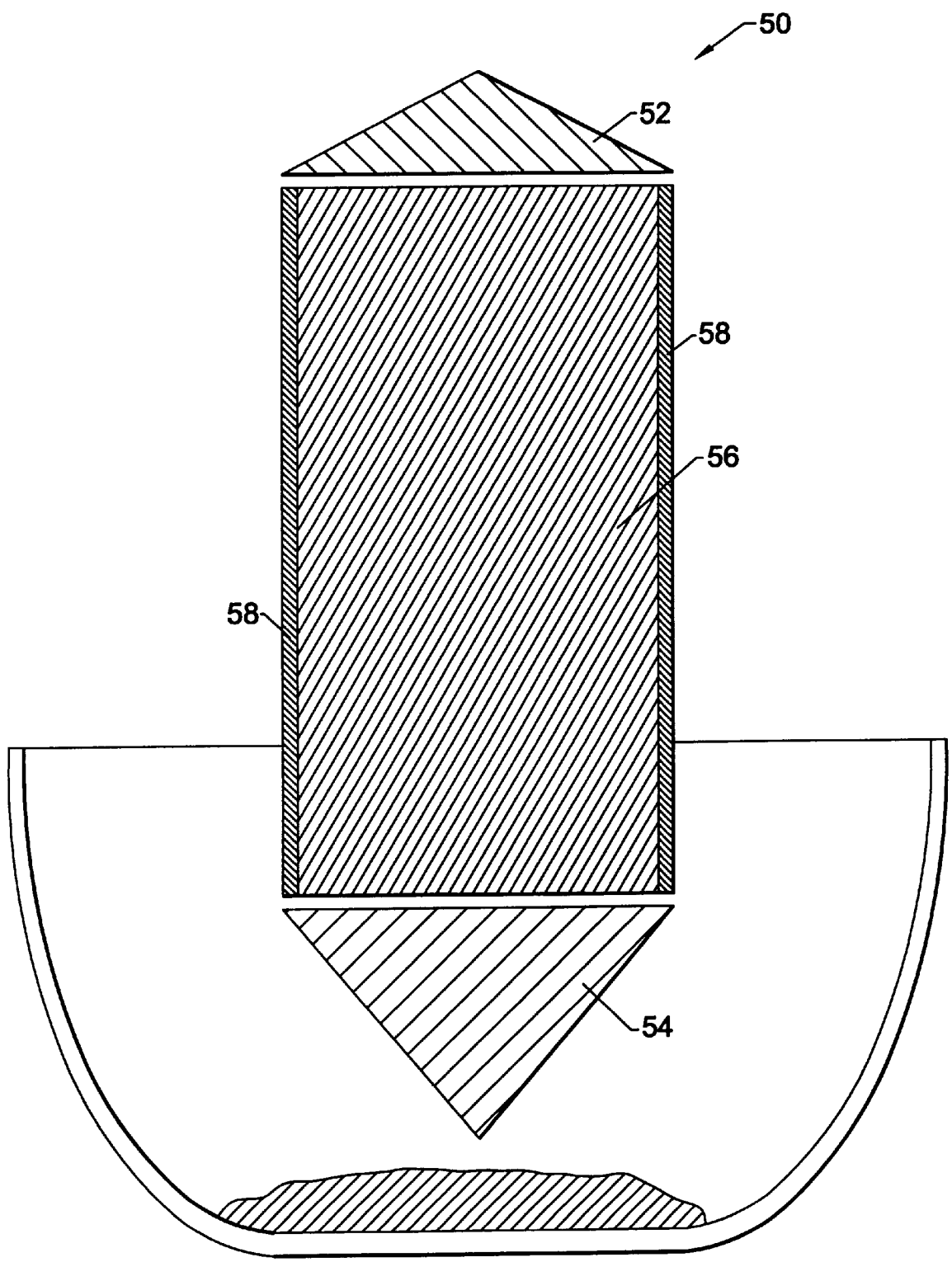
FIG. 4 depicts the structure of a ground crystal of the present invention.

FIG. 4 shows the structure of a crystal produced in accordance with the present invention. Crystal 50 includes a cap-end 52, a tail end 54, and the ground crystal 56. After grinding, crystal 50 loses the surface layer 58. Therefore, a ground crystal does not have the surface layer 58.

Intermediate Productivity: the definition of intermediate productivity is as follows:

(Charge Size×Intermediate Yield)/Cycle Time where the cycle time is the time needed from the start set up to the time of power-off.

In summary, the methods of the present invention drastically reduce bubble adherence to the crucible wall within the melt, resulting in crystals with fewer or no dislocations. Use of the methods of the present invention resulted in single crystal silicon ingot yield improvements owing to a better crystal quality. The methods of the present invention also improved productivity by reducing common troubles during crystal growth. The present invention further improved stabilization time, and the trouble ratio.

It is to be understood that the methods of the present invention can be applied to any crucible type, single crystal pulling process, such as liquid encapsulation CZ of gallium arsenide (GaAs) ingots or others.

The foregoing is meant to illustrate, but not to limit, the scope of the invention. Indeed, those of ordinary skill in the art can readily envision and produce further embodiments, based on the teachings herein, without undue experimentation.

The present invention may be embodied in other specific forms without departing from its essential characteristics. The described embodiment is to be considered in all respects only as illustrative and not as restrictive. The scope of the invention is, therefore, indicated by the appended claims rather than by the foregoing description All changes which come within the meaning and range of the equivalence of the claims are to be embraced within their scope.

What is claimed is:

1. A method of stabilizing a silicon melt, containing bubbles and polysilicon particles, contained in a crucible of a Czochralski (CZ) silicon crystal puller which is utilized for growing a single crystal ingot, comprising the steps of:

providing a mechanism capable of rotating the crucible at various rates of rotation during both a stabilization period and a growth period;

stabilizing the silicon melt during the stabilization period;

growing the single crystal ingot during the growth period following the stabilization period; and varying the rates of rotation while the polysilicon is melting during the stabilization period and prior to insertion of the seed crystal into the silicon melt such that the bubbles and polysilicon particles contained in the silicon melt are reduced during the stabilization period prior to the insertion of the seed crystal into the silicon melt.

2. The method of claim 1, wherein said step (b) includes varying the rates of rotation in accordance with a predetermined rotation pattern which includes accelerating the rate of rotation of the crucible up and down between a high rate of rotation and a low rate of rotation during a given period prior to the growth of the crystal ingot.

3. The method of claim 2, wherein said rotation pattern further comprises a series of consecutive cycles.

4. The method of claim 2, wherein said acceleration of the rate of the rotation of the crucible is accomplished within a time range of about 20 seconds.

5. The method of claim 3, wherein each of said consecutive cycles is of approximately 1 to 999 seconds duration.

6. The method of claim 3, wherein each of said consecutive cycles has a like cycle length.

7. The method of claim 3, wherein each of said consecutive cycles has a different cycle length.

8. The method of claim 3, wherein each of said consecutive cycles has a different high rate of rotation.

9. The method of claim 3, wherein each of said consecutive cycles has a different low rate of rotation.

10. The method of claim 2, wherein said crucible has a rotation rate during the growth of a neck section of the crystal ingot, and said high rate of rotation is approximately the same as the crucible rotation rate during the growth of a neck section of the crystal ingot.

11. The method of claim 2, wherein said crucible has a rotation rate during the growth of the single crystal ingot, and said high rate of rotation is approximately the same as the crucible rotation rate during the growth of the single crystal ingot.

12. The method of claim 2, wherein said crucible has a rotation rate at the completion of the stabilization of the silicon melt, and the low rate of rotation is approximately the same as the crucible rotation rate at the completion of the stabilization of the silicon melt.

13. The method of claim 2, wherein said high rate of rotation is approximately 16 rpm.

14. The method of claim 2, wherein said low rate of rotation is approximately 4 rpm.

15. The method of claim 1, wherein the rates of rotation are varied during a period of stabilizing the silicon melt.

16. The method of claim 1, wherein the rates of rotation are varied in accordance with an oscillating crucible rotation pattern.

17. The method of claim 16, wherein said oscillating crucible rotation pattern includes a single phase oscillating rotational change between 0 rpm and a maximum rpm.

18. The method of claim 16, wherein said oscillating crucible rotation pattern includes an oscillating rotational change with varying amplitude and frequency.

19. The method of claim 1, wherein the rates of rotation are varied in accordance with a saw tooth rotational pattern.

20. The method of claim 19, wherein said saw tooth rotational pattern includes a fast raising and slow falling saw tooth rotational change between forward and reverse rotation.

21. The method of claim 19, wherein said saw tooth rotational pattern includes a fast rising and slow falling saw tooth rotational change between 0 and maximum rpm.

22. The method of claim 19, wherein said saw tooth rotational pattern includes an even saw tooth rotational change.

23. The method of claim 16, wherein said oscillating crucible rotation pattern includes accelerating the rate of rotation of the crucible up and down between a high rate of rotation and a low rate of rotation during a given period prior to the growth of the crystal ingot.

24. The method of claim 23, wherein said oscillating crucible rotation pattern further comprises a series of consecutive cycles including a first cycle, a multiplicity of intermediate cycles and a last cycle.

25. A method of rotating a crucible of a Czochralski (CZ) crystal puller comprising the steps of:

rotating the crucible according to a first cycle, wherein said first cycle includes a first half thereof in which the rate of rotation starts at a low rate of rotation and remains constant thereat, and a second half thereof in which the rate of rotation accelerates to a higher rate of rotation and gradually increases therefrom;

thereafter rotating the crucible according to a multiplicity of intermediate cycles, wherein a plurality of the intermediate cycles each include first and second halves in which the rate of rotation is constant during one of the halves and gradually increases during the other half; and thereafter rotating the crucible according to a last cycle, wherein said last cycle has a first half thereof in which the rate of rotation begins at a rate slightly below a high rate of rotation and gradually increases therefrom, and a second half thereof in which the rate of rotation accelerates up to the high rate of rotation and remains constant thereat.

26. The method of claim 25, wherein said multiplicity of intermediate cycles further comprises a shifting cycle between said first cycle and said last cycle which has a first half thereof wherein the rate of rotation oscillates to said low rate of rotation and remains constant thereat, and a second half thereof wherein the rate of rotation accelerates to said high rate of rotation and remains constant thereat.

27. The method of claim 25, wherein said multiplicity of intermediate cycles further comprises a series of cycles between said first cycle and said shifting cycle wherein the amplitude of oscillation increases.

28. The method of claim 25, wherein said multiplicity of intermediate cycles further comprises a cycle which immediately follows said shifting cycle and has a first half thereof wherein the rate of rotation oscillates back to said low rate of rotation but gradually increases therefrom, and a second half thereof wherein the rate of rotation accelerates up to the high rate of rotation and remains constant thereat.

29. The method of claim 25, wherein said multiplicity of intermediate cycles further comprises a series of cycles between said shifting cycle and said last cycle wherein the amplitude of oscillation decreases.

30. A method according to claim 25 wherein said multiplicity of intermediate cycles comprises a plurality of intermediate cycles which immediately follow said first cycle and which each have a first half thereof in which the rate of rotation remains at the low rate of rotation, and a second half thereof in which the rate of rotation accelerates to another higher level and gradually increases therefrom.

* * * * *